United States Patent

Liukkonen

Patent Number: 5,263,178
Date of Patent: Nov. 16, 1993

[54] PROCEDURE FOR ARRANGING SWITCH-TYPE CONTROL IN A RADIO TELEPHONE

[75] Inventor: Jorma Liukkonen, Helsinki, Finland

[73] Assignee: Nokie Mobile Phones Ltd., Salo, Finland

[21] Appl. No.: 770,879

[22] Filed: Oct. 3, 1991

[30] Foreign Application Priority Data

Oct. 5, 1990 [FI] Finland ................... 904924

[51] Int. Cl.⁵ ............................................. H04B 1/40
[52] U.S. Cl. ................................ 455/76; 455/161.2; 455/180.3; 455/183.2; 455/260; 307/520; 328/155
[58] Field of Search ............... 307/520, 521, 522, 262; 328/167, 155; 455/75, 76, 161.1, 161.2, 165.1, 180.3, 183.1, 183.2, 260

[56] References Cited

U.S. PATENT DOCUMENTS

| | | | |
|---|---|---|---|
| 3,548,322 | 12/1970 | James | 328/167 |
| 4,092,594 | 5/1978 | Baker | 455/76 |
| 4,498,191 | 2/1985 | Rogers | 455/183.7 |
| 4,703,520 | 10/1987 | Rozanski, Jr. et al. | 455/260 |
| 4,743,864 | 5/1988 | Nakagawa et al. | 331/1 A |
| 4,769,563 | 9/1988 | Holberg et al. | 328/167 |
| 4,963,838 | 10/1990 | Hareyama | 455/260 |

FOREIGN PATENT DOCUMENTS 0211594 2/1987 European Pat. Off. .
9010978 9/1990 PCT Int'l Appl. .

Primary Examiner—Reinhard J. Eisenzopf
Assistant Examiner—Timothy H. Keough
Attorney, Agent, or Firm—Darby & Darby

[57] ABSTRACT

The radio unit of a modern radio telephone comprises a plurality of controlled two-position switches. Each controlled switch most often requires an individual control line from a processor. The greater the number of controlled switches in the circuit, the more control lines that are needed. The number of control lines is substantially reduced in that from one or several control lines of a frequency synthesizer in the radio unit, a switch line is branched off for the controlled switches. During the time in which the synthesizer circuit receives no control signals, the logic unit of the radio telephone supplies a control voltage to the controlled switches over a control line of the synthesizer and over a switch line branched therefrom.

8 Claims, 1 Drawing Sheet

PROCEDURE FOR ARRANGING SWITCH-TYPE CONTROL IN A RADIO TELEPHONE

BACKGROUND OF THE INVENTION

The present invention relates to a procedure by which the controlling of on/off type switches of a radio unit or the RF part of a radio telephone can be arranged without having to draw separate control lines from the logic unit of the telephone to the switches.

The radio part of any modern radio telephone comprises a plurality of controlled switches with which a given electrical circuit can be switched to be active or off, or its parameters can be changed. These switches are two-position switches, normally bipolar transistors or FETs, and they control, for instance, switchable filters or regulators of the transmitter. These switches are in turn controlled by a logic unit (processor) of the radio telephone, from which an individual control line, i.e. a lead, extends to each switch and over which a logic "1" or "0", i.e. voltage "high" or "low", is carried to the base of the transistor or FET serving as the switch. The logic unit also controls frequency synthesizers by which the local oscillator frequencies of the transmitter and receiver are produced. As is known in the art, a frequency synthesizer comprises a phase-locked loop (PLL) with a phase comparator, a voltage controlled oscillator (VCO), and a programmable divider, dividing the initial frequency of the VCO prior to its being carried to the second input of the phase comparator. The initial frequency of the loop is determined by the above mentioned programmable divider. The logic unit sets the frequency synthesizer to the desired channel by changing, over a control line, the division number of the divider to be consistent with the desired channel. Usually there are three control lines: by one of these lines the division number is supplied in binary serial form to the register of the phase-locked loop; by a second line a timing signal (clock pulse) is sent, and by the third line, an enable pulse, which on arrival in the phase-locked loop causes the loop division number, supplied to the registers, to be transmitted from the registers of the loop circuit to become the contents of counters.

Also such frequency synthesizer components, implemented using one integrated circuit, are known in the art in which the control word used for channel change sets certain connecting pins of the circuit to a "one" or "zero" state. From these pins, control may be derived for external controlled switches. In these circuits, the decoding logic required for implementing the function is integrated into the PLL circuit.

The switch control line methods of the prior art are encumbered by some drawbacks. As mentioned above, each controlled switch in the radio unit requires an individual control line from a processor, although in certain instances one control line is able to control a number of switches. Therefore, the greater the number of controlled switches in the circuit, the more control lines which are needed. This is an inconvenience when designing a circuit board. If the switches to be controlled and the processor are mounted on separate circuit boards, a multiple pin connector is needed to transfer the control signals from one board to another. If connecting pins of the PLL circuit are utilized in the switch control, the number of pins must be increased, and this leads to greater physical bulk. This is a nuisance in developing telephones of smaller size. Furthermore, it may be noted that PLL components of this type that are appropriate for portable telephone applications, are hard to find.

SUMMARY OF THE INVENTION

The present invention discloses a way in which control of switches can be implemented without the above drawbacks. The invention is characterized in that from one or several control lines of the synthesizer, a switch line branches to the switches being controlled, and during the period when the synthesizer receives no control signal, a logic unit supplies a control voltage to the controlled switches over the synthesizer control line and the branched switch line.

Since the control lines of the phase-locked loop are active only for the time needed in feeding the division number to the registers of the loop circuit, i.e. about one millisecond, the processor of the radio telephone may during the remainder of the time, use the control lines of the PLL circuit as control lines for on/off control of switches in the radio unit. During that time when the PLL circuit receives no external control, i.e. while no new division number is being supplied, its control lines are in a zero state, and the state of the clock and data lines can then be changed without affecting the operation of the PLL circuit in any way. The state of the line by which the enable pulse is supplied must not be changed because it effects a change in the starting frequency of the loop. Therefore, the clock and data lines can indeed be used for controlling the switches. If a plurality of synthesizers are used in the RF unit of the telephone, the control lines of all these synthesizers are available for controlling the switches as taught by the invention.

BRIEF DESCRIPTION OF THE DRAWING

The invention is described in more detail, referring to the accompanying schematic diagram of the sole FIGURE.

DESCRIPTION OF A PREFERRED EMBODIMENT

Figure 1:
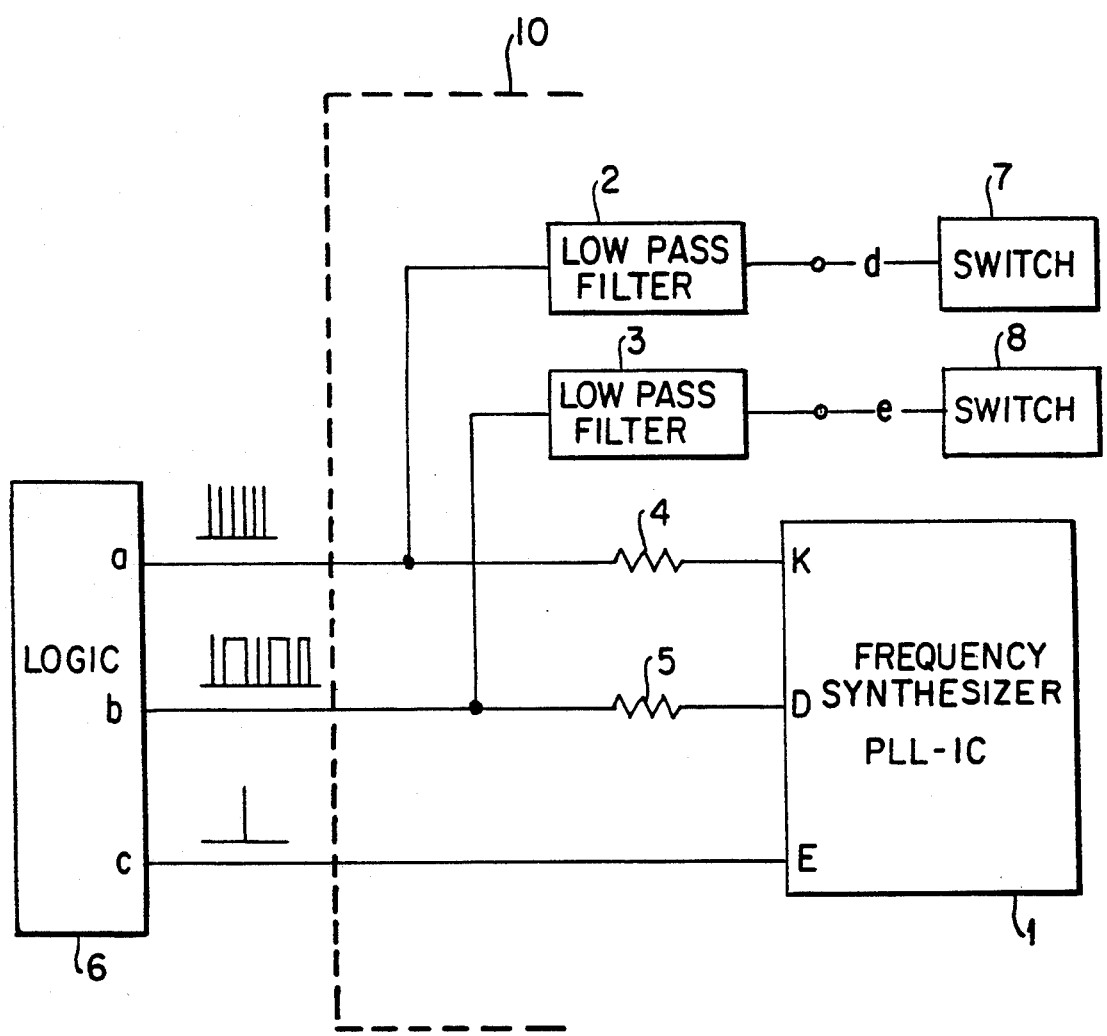

In an RF part 10 of a radio telephone, reference numeral 1 refers to a phase-locked loop frequency synthesizer circuit. A phase-locked loop in its entirety, or parts thereof, most usually a phase comparator and dividers, is integrated into one chip. A connecting pin K of the circuit receives timing pulses from a control logic unit 6 via a line a. A connecting pin D receives a division number for a loop divider in the synthesizer 1 in binary serial form by a line b, and via a line c an enable pulse arrives at a connecting pin E of the synthesizer 1.

When the starting frequency of the PLL circuit is going to be changed, a processor (not shown) in the logic unit 6 transmits on lines a and b a binary word indicating the clock pulses and the division number, respectively. Thereafter, the processor transmits a sharp enable pulse on line resulting in the division number transferring within the PLL circuit from registers to a counter. After the PLL circuit has locked onto the selected frequency, the lines a, b and c are placed in a "zero" state. During the time of the zero state, control voltages for switches 7, 8 can be transmitted from the processor by the lines a and b, and further by a switch line d connected to the line a, and by a switch line e connected to the line b, and then to the switches 7, 8 which are being controlled. Thus control of these switches 7, 8 takes place simply by setting the channel control line and/or clock line of the PLL, as required by the need of control, to state one or zero.

Disturbances caused in the switch lines d and e, by the feeding of a division number to the synthesizer numeral 1, is attenuated by means of a low pass filter 2, 3 included in each line; these filters may be simple RC filters. Hereby, the voltage on lines d and e cannot ascend to such a level during the feeding of division numbers that it would cause a change in the state of the switches 7, 8. Resistors 4, 5 in the inputs of pins K and D of synthesizer circuit 1 serve as attenuation resistors. Voltage waveforms, on the lines are also outlined in the FIGURE.

With the procedure of the invention, the use of extra switch control lines can be avoided, and it is not necessary to use any such PLL component containing extra logic on the pins K, D where the control voltage for the switches could be obtained. The lines d, e to the switches can be connected at any point of the control lines. In a connector (not shown) which may be needed at an interface of the RF part and the logic unit 6, no pins need be provided for controlling the switches 7, 8. Hence, a smaller connector can be used. The procedure here disclosed is simple and inexpensive in implementation.

I claim:

1. A method for controlling a frequency synthesizer circuit and switches for a radio unit of a radio telephone having a logic unit, comprising the steps of:
   providing frequency synthesizer circuit means connected to said logic unit of said radio telephone by a plurality of first control lines, said frequency synthesizer circuit means including a phase-locked loop;
   providing at least one said radio unit switches with a connection to said logic unit, said connection including at least one second control line connected at one end to said at least one switch and at the other end to a selected one of said first control lines at a position intermediate said logic unit and said synthesizer circuit means;
   outputting first control signals from said logic unit onto said first control lines during a first time period to select performance of said synthesizer circuit means; and
   outputting second control signals from said logic unit onto said first control lines, and via said connection onto said at least one second control line, during a second time period to control an operating state of said at least one switch.

2. A method as in claim 1, further comprising the step:
   providing low pass filter means in said at least one second control line to inhibit said first control signals from affecting the operating state of said at least one switch.

3. A method as in claim 2, further comprising the step of providing enable signals to said synthesizer circuit means from said logic unit during said first time period via a selected one of said first control lines, signals on the remaining first control lines being entered in said synthesizer circuit means in response to said enable signal, said selected first control line being independent of said at least one switch.

4. A method as in claim 1, further comprising the step of providing enable signals to said synthesizer circuit means from said logic unit during said first time period via a selected one of said first control lines, signals on the remaining first control lines being entered in said synthesizer circuit means in response to said enable signal, said selected first control line being independent of said at least one switch.

5. A control circuit arrangement in a radio telephone, comprising:
   a logic unit for providing first control signals during a first time period, and second control signals during a second time period;
   a frequency synthesizer means including a phase-locked loop, performance of said frequency synthesizer means being set by input of said first control signals from said logic unit;
   a plurality of first control lines connected between said logic unit and said frequency synthesizer means for carrying said first control signals from said logic unit to said frequency synthesizer means;
   at least one control switch requiring a second control signal to set the operating state of said switch;
   at least one second control line connected respectively between said at least one switch and a connection to a first control line, said connection being between said frequency synthesizer means and said logic unit, said second control signals being provided to said at least one switch during said second time period when said synthesizer means receives no first control signals.

6. A circuit arrangement as in claim 5, further comprising low pass filter means in said at least one second control line to inhibit said first control signals from affecting the operating state of said at least one switch.

7. A circuit arrangement as in claim 6, wherein one of said first control signals provides an enable pulse to said frequency synthesizer means via a selected first control line, said enable pulse causing said first control signals to enter into said frequency synthesizer means, said selected first control line being independent of said at least one switch and its associated second control line.

8. A circuit arrangement as in claim 5, wherein one of said first control signals provides an enable pulse to said frequency synthesizer means via a selected first control line, said enable pulse causing said first control signals to enter into said frequency synthesizer means, said selected first control line being independent of said at least one switch and its associated second control line.

* * * * *

UNITED STATES PATENT AND TRADEMARK OFFICE
CERTIFICATE OF CORRECTION

PATENT NO. : 5,263,178
DATED : November 16, 1993
INVENTOR(S) : Jorma LIUKKONEN It is certified that error appears in the above-identified patent and that said Letters Patent is hereby corrected as shown below:

On the title page, item (73):

The Assignee's name is incorrect and should read --Nokia Mobile Phones Ltd.-- and not "Nokie Mobile Phones Ltd.".

Signed and Sealed this

Seventh Day of June, 1994

Attest:

BRUCE LEHMAN

Attesting Officer

Commissioner of Patents and Trademarks